(12) United States Patent
Hung et al.

(10) Patent No.: US 12,289,916 B2
(45) Date of Patent: Apr. 29, 2025

(54) SEMICONDUCTOR STRUCTURE

(71) Applicant: UNITED MICROELECTRONICS CORP., Hsin-Chu (TW)

(72) Inventors: Wei-Cheng Hung, New Taipei (TW); Yu-Jen Liu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/608,949

(22) Filed: Mar. 19, 2024

(65) Prior Publication Data

US 2024/0222457 A1    Jul. 4, 2024

Related U.S. Application Data

(63) Continuation of application No. 17/376,151, filed on Jul. 14, 2021, now Pat. No. 12,040,370.

(30) Foreign Application Priority Data

Jun. 17, 2021   (CN) .......................... 202110671747.X

(51) Int. Cl.
*H10D 64/27* (2025.01)
*H10D 30/60* (2025.01)
*H10D 84/01* (2025.01)
*H10D 84/03* (2025.01)

(52) U.S. Cl.
CPC ........... *H10D 64/517* (2025.01); *H10D 30/60* (2025.01); *H10D 84/0135* (2025.01); *H10D 84/038* (2025.01)

(58) Field of Classification Search
CPC .............. H01L 29/42372; H01L 29/78; H01L 21/823437; H10D 64/517; H10D 84/0135; H10D 84/03; H10D 30/60
USPC ....................................................... 257/288
See application file for complete search history.

(56) References Cited

U.S. PATENT DOCUMENTS

| | | |
|---|---|---|
| 5,415,835 A | 5/1995 | Brueck |
| 2016/0086841 A1* | 3/2016 | Song ................... H01L 29/165 438/424 |
| 2018/0158908 A1* | 6/2018 | Yang ................... H01L 29/1033 |
| 2019/0165172 A1 | 5/2019 | Joshi |

* cited by examiner

*Primary Examiner* — Monica D Harrison
(74) *Attorney, Agent, or Firm* — Winston Hsu

(57) ABSTRACT

The invention provides a semiconductor structure, the semiconductor structure includes a substrate, a transistor disposed on the substrate, wherein the transistor comprises a gate structure, a source and a drain, and the gate structure of the transistor located on the substrate and extending along a first direction, and a plurality of supporting patterns located in the gate structure of the transistor, wherein the plurality of supporting patterns are separated from each other and arranged along a second direction, wherein the second direction is perpendicular to the first direction, and wherein at least four supporting patterns of the plurality of supporting patterns constitute a supporting pattern dashed line, wherein the supporting pattern dashed line extends along the second direction.

7 Claims, 2 Drawing Sheets

SEMICONDUCTOR STRUCTURE

CROSS REFERENCE TO RELATED APPLICATIONS

This application is a continuation application of U.S. application Ser. No. 17/376,151, filed on Jul. 14, 2021. The content of the application is incorporated herein by reference.

BACKGROUND OF THE INVENTION

1. Field of the Invention

The present invention relates to the field of semiconductor manufacturing, in particular to a gate with a supporting pattern and a manufacturing method thereof, which can avoid the dishing phenomenon in the gate manufacturing process.

2. Description of the Prior Art

In the field of semiconductor manufacturing, planarization is often used to remove part of the material layer, so that the surface of the device is flat. However, when the density difference between the device area and the surrounding area is large, when the planarization step (such as chemical mechanical polishing, CMP) is used, because the removal rate of the device dense area (often called dense area) and the device loose area (often called ISO area) is different, the top of a specific area or device (usually the area with lower device density) may be more polished and a concave profile will be produced. This phenomenon is called dishing The above-mentioned dishing phenomenon may adversely affect the quality of components, so it is necessary to find solutions to overcome the above-mentioned problems.

SUMMARY OF THE INVENTION

The invention provides a semiconductor structure, which comprises a substrate, a gate structure which extends along a first direction, and a plurality of supporting patterns which are separated from each other and arranged along a second direction which is perpendicular to the first direction.

The present invention also provides a method for forming a semiconductor structure, which comprises providing a substrate, forming a gate structure extending along a first direction, and forming a plurality of supporting patterns in the gate structure, wherein the plurality of supporting patterns are separated from each other and arranged along a second direction, wherein the second direction is perpendicular to the first direction.

The invention is characterized in that a plurality of supporting patterns are formed in the gate to avoid the problem that the top of the gate is sunken (i.e. the dishing phenomenon) when the gate is planarized. In addition, the arrangement direction of the supporting patterns in the present invention is parallel to the current direction (i.e., the direction from source to drain), so that the current flow path is less hindered, and the performance of the gate is better.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
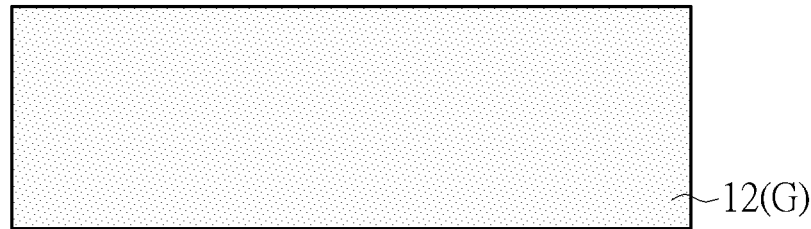
FIG. 1 to FIG. 2 show a top view of a semiconductor structure according to an embodiment of the present invention.
Figure 2:
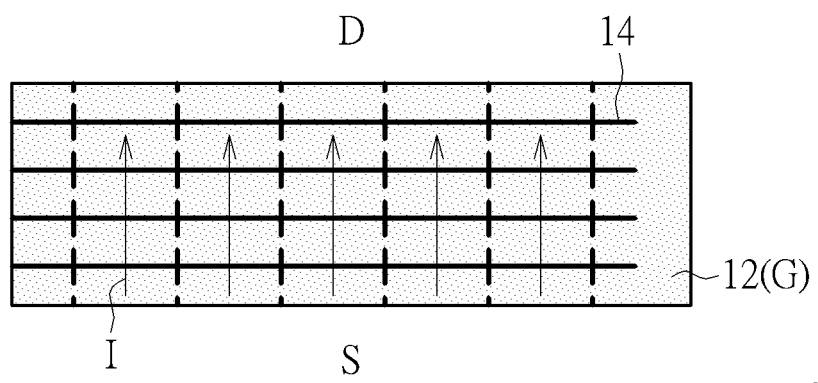
Figure 2:
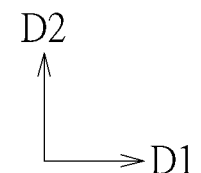

FIG. 1 to FIG. 2 show a top view of a semiconductor structure according to an embodiment of the present invention. As shown in FIG. 1, first, a substrate 10, such as a silicon substrate, is provided, and a sacrificial gate 12 (or a gate G) is formed on the substrate 10. The sacrificial gate 12 is made of polysilicon, for example. In the following steps, source/drain regions and dielectric layers (not shown) are formed on both sides of the sacrificial gate 12, and then a planarization step and an etching step are sequentially performed, and the sacrificial gate 12 is removed and replaced with a gate made of other materials such as metal. Details will be described in the following paragraphs.

After the sacrificial gate 12 is completed, as shown in FIG. 2, a source S and a drain D are defined on both sides of the sacrificial gate 12 by ion implantation. A first direction D1 and a second direction D2 are defined here, the first direction D1 is parallel to the extending direction of the sacrificial gate 12, and the second direction D2 is perpendicular to the first direction, and the gate G, the source S and the drain D here can form a transistor, wherein the current direction I of the transistor flows from the source S to the drain D, and the second direction D2 is parallel to the current direction I.

In a subsequent step, a dielectric layer (not shown) is formed around the sacrificial gate 12 to cover the sacrificial gate 12, and then a planarization step (such as chemical mechanical polishing, CMP) is performed to remove the redundant dielectric layer, so that the top surface of the dielectric layer is flush with the top surface of the sacrificial gate 12, and the top surface of the sacrificial gate 12 is exposed. Then, an etching step is performed to remove the sacrificial gate 12 and fill in other material layers (such as a high-k metal layer) to form a new metal gate (not shown) at the original sacrificial gate 12. However, in the above planarization step, the top surface of the gate may have a dishing phenomenon as described in the prior art. Therefore, in order to avoid such a problem, the present invention further includes forming a plurality of supporting patterns 14 in the sacrificial gate 12 after the sacrificial gate 12 is completed. The material of the supporting pattern 14 is an insulating material such as silicon oxide. The method for forming the supporting pattern 14 includes, for example, performing a patterning etching step after the sacrificial gate 12 is completed to form some recesses (corresponding to the shape of the final supporting pattern) in the sacrificial gate, and filling the recesses while filling a dielectric layer around the sacrificial gate 12, so that a dielectric layer (not shown) around the sacrificial gate 12 and the supporting pattern 14 in the sacrificial gate 12 can be formed at the same time.

In this embodiment, the supporting pattern 14 has a grid-like shape, that is, the supporting pattern 14 includes a plurality of lines, some of which extend along the first direction D1, and the other extends along the second direction D2. However, the applicant's experimental results show that although the formation of the supporting pattern 14 can reduce the probability of the dishing phenomenon, if the supporting pattern 14 contains a line pattern parallel to the first direction D1 (i.e., perpendicular to the current direction I), the current transmission effect in the gate will be hindered. In other words, this will significantly reduce the current conduction performance of the gate, which is not conducive to the electrical performance of the gate.

Figure 3:
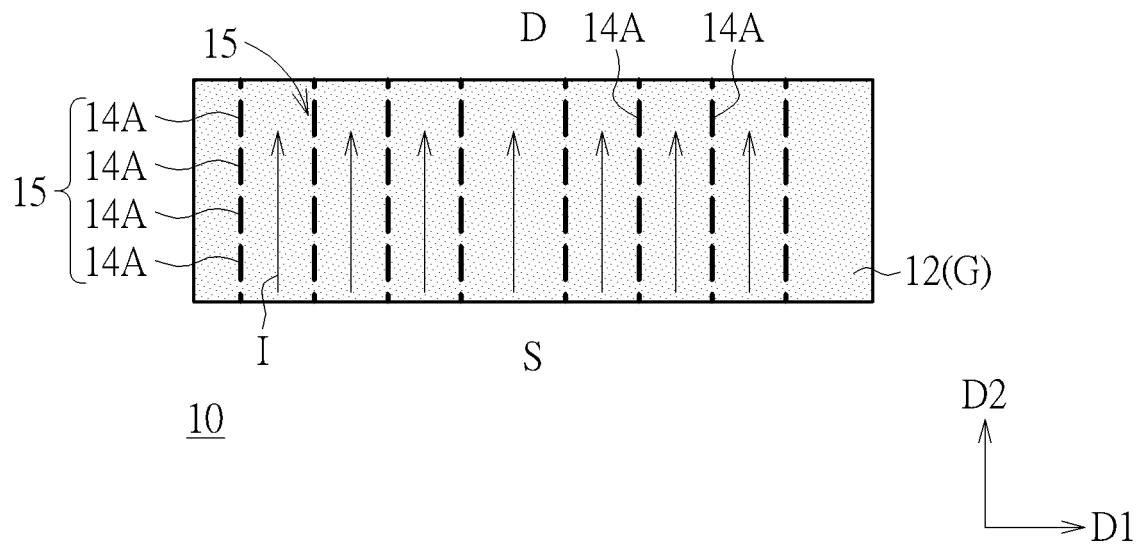
FIG. 3 to FIG. 4 are schematic top views of a semiconductor structure according to another embodiment of the present invention.
Figure 4:
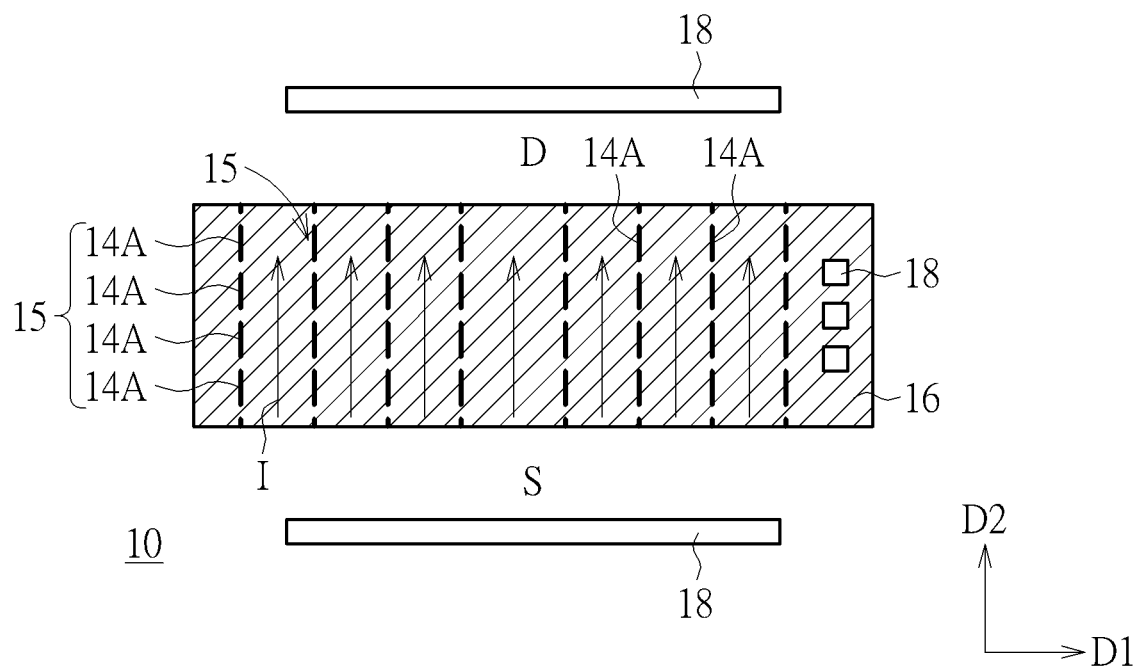

FIG. 3 to FIG. 4 are schematic top views of a semiconductor structure according to another embodiment of the present invention. In order to further improve the above problems, in another embodiment of the present invention, as shown in FIG. 3 and FIG. 4, the shape of the supporting pattern is changed in this embodiment, and the original supporting pattern 14 is replaced by the supporting pattern 14A. The main difference between the supporting pattern 14A and the supporting pattern 14 is that the pattern arranged by the supporting pattern 14A does not block the current direction I. More specifically, the supporting pattern 14A constitutes a plurality of supporting pattern dashed lines 15 arranged along the second direction D2, and the gap between the adjacent supporting pattern dashed lines 15 still leaves the gate material, and the supporting pattern 14A is not formed between the gap. Therefore, the plurality of supporting patterns 14A do not block the path (current direction I) through which the main current of the transistor flows. Therefore, compared with the above embodiments, even if the supporting pattern 14A is formed inside the gate in this embodiment, it has less influence on the electrical properties of the gate.

Then, as shown in FIG. 4, the sacrificial gate 12 is removed by an etching step (not shown), and each supporting pattern 14A is left, and then a metal layer, such as a high-k metal (high dielectric constant metal) layer, is refilled into the recess of the original sacrificial gate 12 to form a metal gate 16. The above steps are also called replacement metal gate (RMG) process, which belongs to the conventional technology in the field and will not be described in detail here. In addition, after the metal gate 16 is completed, a plurality of contact structures 18 can be formed on the metal gate 12 and the source S/ drain D, and the contact structures 18 can electrically connect the transistor with other electronic devices. The manufacturing process of the contact structures 18 is also a conventional technology in the field, and will not be described in detail here.

According to the above description and drawings, the present invention provides a semiconductor structure, which comprises a substrate 10, a metal gate 16 extending along a first direction D1, and a plurality of supporting patterns 14A in the metal gate 16, wherein the plurality of supporting patterns 14A are separated from each other and arranged along a second direction D2, wherein the second direction D2 is perpendicular to the first direction D1.

In some embodiments of the present invention, a source S and a drain D are further included, which are located on both sides of the metal gate 16.

In some embodiments of the present invention, the connection between the source S and the drain D is parallel to the second direction D2.

In some embodiments of the present invention, a plurality of supporting patterns 14A constitute a plurality of supporting pattern dashed lines 15, wherein each supporting pattern dashed line 15 extends along the second direction D2.

In some embodiments of the present invention, the material of the supporting pattern 14A includes silicon oxide.

In some embodiments of the present invention, the metal gate 16 is made of high dielectric constant metal.

The present invention also provides a method for forming a semiconductor structure, which includes providing a substrate 10, forming a metal gate 16 extending along a first direction D1 on the substrate 10, and forming a plurality of supporting patterns 14A in the metal gate 16, wherein the plurality of supporting patterns 14A are separated from each other and arranged along a second direction D2, wherein the second direction D2 is perpendicular to the first direction.

In some embodiments of the present invention, the method for forming the supporting pattern 14A in the metal gate 16 includes forming a sacrificial gate 12 on the substrate 10, performing an etching step on the sacrificial gate 12 to form a plurality of holes in the sacrificial gate 12, filling an insulating layer beside the sacrificial gate and filling in the holes, performing a planarization step to remove part of the insulating layer, exposing the surface of the sacrificial gate 12, removing the sacrificial gate layer, leaving the insulating layers, defining a gate recess, and forming a high dielectric constant metal layer in the gate recess.

The invention is characterized in that a plurality of supporting patterns are formed in the gate to avoid the problem that the top of the gate is sunken when the gate is planarized. In addition, the arrangement direction of the supporting patterns in the present invention is parallel to the current direction (i.e., the direction from source to drain), so that the current flow path is less hindered, and the performance of the gate is better.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a transistor disposed on the substrate, wherein the transistor comprises a gate structure, a source and a drain, and the gate structure of the transistor located on the substrate and extending along a first direction; and
   a plurality of supporting patterns located in the gate structure of the transistor, wherein the plurality of supporting patterns are separated from each other and arranged along a second direction, wherein the second direction is perpendicular to the first direction, and wherein at least four supporting patterns of the plurality of supporting patterns constitute a supporting pattern dashed line, wherein the supporting pattern dashed line extends along the second direction;
   a plane consisting of the first direction and the second direction, and the plurality of supporting patterns are arranged on the plane consisting of the first direction and the second direction, wherein the plane consisting of the first direction and the second direction is parallel to a top surface of the substrate.

2. The semiconductor structure according to claim 1, wherein the source and the drain are located on both sides of the gate structure.

3. The semiconductor structure according to claim 1, wherein the material of the supporting pattern comprises silicon oxide.

4. The semiconductor structure according to claim 1, wherein the gate structure is made of high dielectric constant metal.

5. The semiconductor structure according to claim 1, wherein the plurality of supporting patterns are included along the first direction.

6. The semiconductor structure according to claim 1, wherein the second direction passes through the source and the drain.

7. The semiconductor structure according to claim 1, wherein each supporting pattern is a line shaped when viewed from a top view, and for each supporting pattern, a width of an edge along the second direction is longer than a width of an edge along the first direction.

\* \* \* \* \*